US008816749B2

(12) United States Patent
Alessandro

(10) Patent No.: US 8,816,749 B2
(45) Date of Patent: Aug. 26, 2014

(54) LEVEL SHIFTER DEVICE

(71) Applicant: STMicroelectronics S.r.l., Agrate Brianza (IT)

(72) Inventor: Agatino Antonino Alessandro, Riposto (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 14/154,272

(22) Filed: Jan. 14, 2014

(65) Prior Publication Data

US 2014/0197872 A1    Jul. 17, 2014

(30) Foreign Application Priority Data

Jan. 17, 2013  (IT) .............................. MI2013A0058

(51) Int. Cl.
*H03L 5/00* (2006.01)
*H03K 19/0175* (2006.01)

(52) U.S. Cl.
CPC ................................. *H03K 19/0175* (2013.01)
USPC ............................... 327/333; 326/62; 326/81

(58) Field of Classification Search
USPC ................... 327/306, 333; 326/62–63, 80–82
See application file for complete search history.

(56) References Cited

U.S. PATENT DOCUMENTS

| 5,880,617 | A | 3/1999 | Tanaka et al. |
| 6,285,233 | B1 * | 9/2001 | Ribellino et al. ............ 327/333 |
| 6,563,357 | B1 * | 5/2003 | Hsu et al. ...................... 327/212 |
| 7,091,748 | B2 * | 8/2006 | Wada .............................. 326/81 |
| 8,587,359 | B2 * | 11/2013 | Saether ......................... 327/333 |
| 2008/0007315 | A1 | 1/2008 | Huang et al. |
| 2009/0230991 | A1 | 9/2009 | Hung et al. |
| 2013/0249595 | A1 * | 9/2013 | Ogawa ........................... 326/68 |

OTHER PUBLICATIONS

Italian Search Report and Written Opinion for IT MI2013A000058 mailed Sep. 11, 2013 (8 pages).

* cited by examiner

*Primary Examiner* — Dinh Le
(74) *Attorney, Agent, or Firm* — Gardere Wynne Sewell LLP

(57) ABSTRACT

A level shifter includes a first terminal configured to receive a first supply voltage, a second terminal configured to receive a second supply voltage, an input terminal configured to receive an input signal and an output terminal. The level shifter is configured to shift the input signal from the level of the first supply voltage to the level of the second supply voltage in outputting the output signal. The level shifter includes a storage circuit for storing the output signal value and configured, when the first supply voltage is no longer available, to force the output terminal to assume the last output voltage value stored by the storage circuit when the first supply voltage was available and before the first supply voltage was not available.

12 Claims, 4 Drawing Sheets

LEVEL SHIFTER DEVICE

PRIORITY CLAIM

This application claims priority from Italian Application for Patent No. MI2013A000058 filed Jan. 17, 2013, the disclosure of which is incorporated by reference.

TECHNICAL FIELD

The present disclosure relates to a level shifter device.

The present invention relates generally to semiconductor integrated circuit devices and level conversion circuits, and more particularly, to semiconductor integrated circuit devices in which a plurality of circuit units driven by a plurality of different power supply voltage are formed on a single substrate, and to level conversion circuits used in the semiconductor integrated circuit devices.

BACKGROUND

A single semiconductor chip may have two or more circuit blocks that are driven by different respective supply voltages, therefore a digital signal is required to shift from one voltage level to another. Level shifting ensures that signals are of the appropriate voltage when travelling between different circuits, or different portions of a single circuit, having different respective supply voltages. A circuit which performs this function is herein referred to as a "level shifter".

A conventional level shifter circuit 100 is illustrated in FIG. 1. The voltages VA and VB represent a first and a second supply voltages, respectively; the voltages VA, VB are also called voltage domains. The level shifter 100 comprises a differential cell 200 including a first circuit portion comprising a couple of NMOS transistors M1, M2 with respective gate terminals arranged to receive a differential digital logic input signal, VIN and its Boolean negated value; therefore an inverter I3 is inserted between the gates of M1 and M2. The inverter I3 is a common NOT gate in CMOS technology which comprises a PMOS transistor and a NMOS transistor, M3 and M4 respectively, with drain and gate terminals in common. The supply voltage VA is connected to the source of the transistor M3 and provides the supply for the inverter I3, while the source terminal of the transistor M4 is connected to the ground GND.

A second portion of the differential cell 200 comprises two PMOS transistors M5, M6 having the gate terminals cross-coupled to the drain terminals of M1 and M2, respectively. The second supply voltage VB is connected to the source terminals of transistors M5 and M6. A single output signal VOUT is provided at the common node between the drain terminals of transistors M2 and M6.

In operation, when the input signal VIN is high, the NMOS transistor M1 turns on, so to pull down the gate of the PMOS transistor M6, which turns on and forces the output node to the voltage VB. Instead, when the input signal VIN is low, the transistor M2 turns on pulling down the output node to ground GND (VOUT=0 V).

If the voltage VA is supplied, the level shifter circuit 100 works properly: the signal VOUT is always polarized according to the signal VIN and no static power consumption is possible from VB. In other words, there is no direct current path between the supply voltage VB and ground GND. But if the first supply voltage VA becomes a high impedance (practically when the source is externally removed) the gate terminals of the transistors M1 and M2 are not correctly polarized and some leakage currents could partially turn on the transistors M1 or M2. In this case the cross conduction of the transistors M5-M1 and M6-M2 may verify and the signal VOUT becomes indeterminate.

A level shifter having very low power consumption is known from U.S. Pat. No. 6,285,233 (see, FIG. 2), the disclosure of which is incorporated by reference. The level shifter 110 is different from the level shifter 100 in FIG. 1 because it includes an additional circuit portion 3 comprising an inverter 8 formed by a complementary pair of transistors M7 and M9, respectively, having their respective gate terminals connected to the first supply voltage VA. Furthermore a NMOS transistor M8 is used to control the connection of the gate terminal of transistor M6 in the differential cell 200 to ground GND. A common node C of the transistors M7 and M9 is connected to the gate terminal of the transistor M8; the transistor M8 has a source terminal connected to ground GND and the drain terminal connected to the gate terminal of the transistor M6. A series of transistors M10, . . . , Mn is inserted between the source terminal of the transistor M9 and the second supply voltage VB. These transistors are of the PMOS type with a diode configuration, having their respective gate and drain terminals short-circuited.

The circuit portion 3 provides the level shifter 110 with a very low consumption in absence of the primary domain VA. In fact, when the first supply voltage VA is low, the transistor M7 is off and the gate terminal of the transistor M8 (node C) is driven by means of the series of PMOS transistors M10, . . . , Mn and the transistor M9. A current Ipd flowing through the transistors M10, . . . , Mn, M9 and M7 has a value such to bring the voltage on the node C to a value sufficient to charge the gate capacitance of the transistor M8 and switch it on. In this condition, the gate terminal of the transistor M6 is pulled to the ground GND by the transistor M8 so to turn on the transistor M6; this forces the drain terminal B to the value of the second supply voltage VB. The output VOUT of the level shifter 110 is thus low, having taken the output from the node B through an inverter.

However this solution has a modest consumption of static current during the normal activity and it does not prevent a possible cross conduction when the primary voltage is not present.

SUMMARY

One aspect of the present disclosure is to provide a level shifter device comprising: a first terminal configured to receive a first supply voltage, a second terminal configured to receive a second supply voltage, an input terminal configured to receive an input signal and an output terminal, said level shifter device being configured to shift the input signal from the level of the first supply voltage to the level of the second supply voltage outputting the output signal at the output terminal, wherein said level shifter device comprises a storage circuit for storing the output signal value and configured, when the first supply voltage is no longer available, to force the output terminal to assume the last output voltage value stored by the storage circuit when the first supply voltage was available and before the first supply voltage was not available.

In an embodiment, a circuit comprises: a differential input stage having a first input configured to receiving an input digital signal and a second input configured to receive a complement of the input digital signal and further having differential outputs; a first inverter circuit powered from a relatively lower supply voltage node and configured to generate the complement of the input digital signal; a latch circuit powered from a relatively higher supply voltage node and having latch nodes coupled respectively to the differential outputs; and a second inverter circuit powered from the relatively higher supply voltage node and having an input coupled to one of said latched nodes.

In another embodiment, a method of level shifting comprises: differentially receiving an input digital signal referenced to a relatively lower supply voltage; latching an inverted logic state of the received input digital signal in a latch circuit referenced to a relatively higher supply voltage; and inverting an output of the latched inverted logic state output from the latch circuit using an inverting circuit referenced to the relatively higher supply voltage.

BRIEF DESCRIPTION OF THE DRAWINGS

For a better understanding of the present invention, a preferred embodiment thereof is now described, purely by way of non-limiting example and with reference to the annexed drawings, wherein.

DETAILED DESCRIPTION OF THE DRAWINGS

Figure 3:
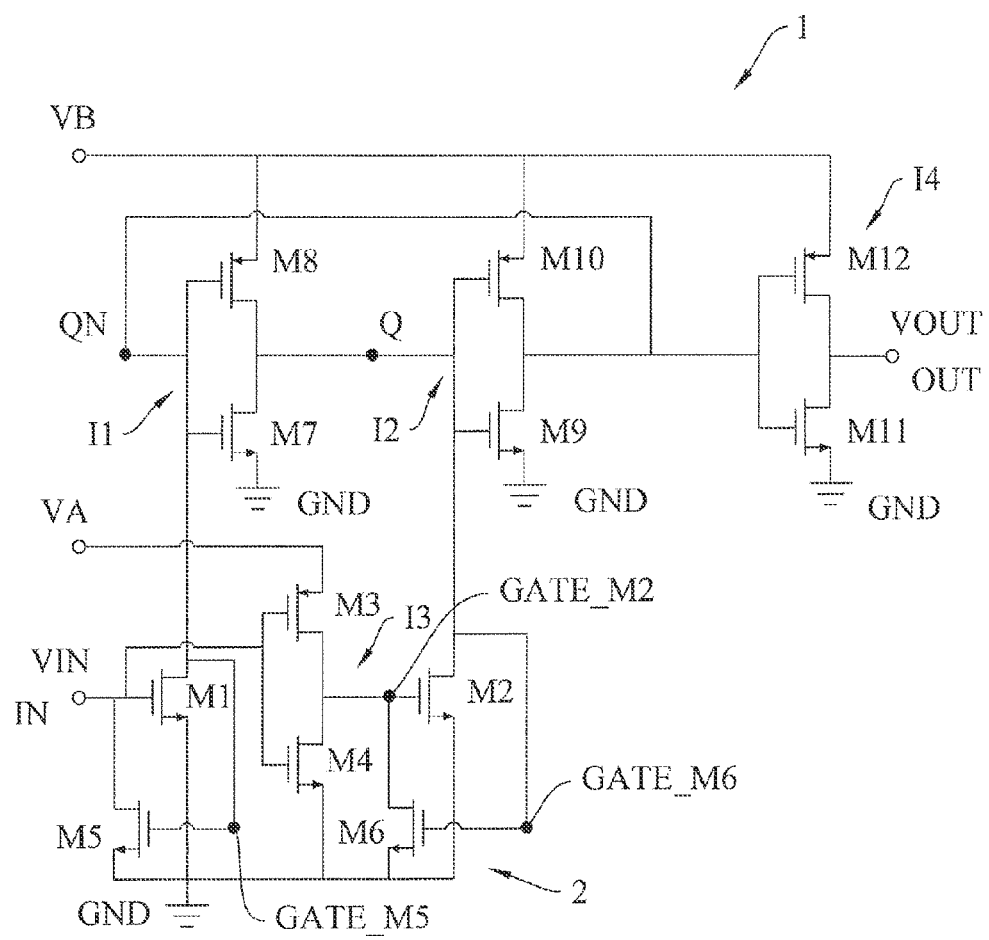
FIG. 3 shows a schematic view of a level shifter device according to the present disclosure.

With reference to FIG. 3 a level shifter device 1 according to the present disclosure is shown.

The level shifter 1 comprises a first terminal configured to receive a first supply voltage VA, or primary voltage domain, and a second terminal configured to receive a second supply voltage VB, or secondary voltage domain; for example VB=5 V and VA=2 V.

The level shifter 1 also comprises a differential cell 2 coupled to the first VA and the second VB supply voltages. The differential cell 2 has an input terminal IN configured to receive an input voltage VIN, and an output terminal OUT for outputting the output voltage VOUT. The level shifter device is configured to shift the input voltage VIN from the level of the first supply voltage VA to the level of the second supply voltage VB with the output signal VOUT at the output terminal. The output voltage VOUT therefore depends on the input voltage VIN and the second supply voltage value VB.

The differential cell 2 comprises a first branch including a first NMOS transistor M1 coupled between a first internal circuit node QN and ground GND, and a second branch including a second NMOS transistors M2 coupled between a second internal circuit node Q and ground GND. The gate terminal of the transistor M1 represents the input terminal IN of the differential cell 2, while the gate terminal GATE_M2 of the transistor M2 receives the output voltage of an inverter I3 connected between the input terminal IN of the differential cell 2 and the terminal GATE_M2; the inverter I3 is coupled between the supply voltage VA and ground GND.

The level shifter 1 comprises a storage circuit configured to store the output voltage value VOUT and to force, when the first supply voltage VA is no longer available, the output terminal OUT to assume the last voltage value VOUT stored by the storage circuit when the first supply voltage VA was available and before the first supply voltage VA was not available. In this way undesired changes of the output voltage VOUT when the first power supply voltage VA becomes a high impedance source are prevented.

The storage circuit is preferably a latch and is configured to drive through the first internal circuit node QN a first pull-down component M5 and through the second internal circuit node Q a second pull-down component M6. Preferably the first and second pull-down component are the transistor M5 and M6, preferably NMOS transistors, having the drivable terminals GATE_M5 and GATE_M6 connected respectively to the first QN and second Q internal circuit nodes.

The latch comprises a first inverter I1, having an input terminal connected to the first internal circuit node QN and an output terminal connected to the second internal circuit node Q, and the second inverter I2, cascaded to the first inverter I1, having an input terminal connected to the second internal circuit node Q and an output terminal connected to the first internal circuit node QN; the inverters I1 and I2 are coupled between the second supply voltage VB and ground GND.

The voltages at the node Q and QN are two digital opposite voltage values according to the second supply voltage VB.

The level shifter 1 comprises another inverter I4 cascaded to the latch, having the input terminal connected to the first internal circuit node QN while the output terminal is output terminal OUT of the level shifter; the inverter I4 is coupled between the second supply voltage VB and ground GND.

Figure 1:
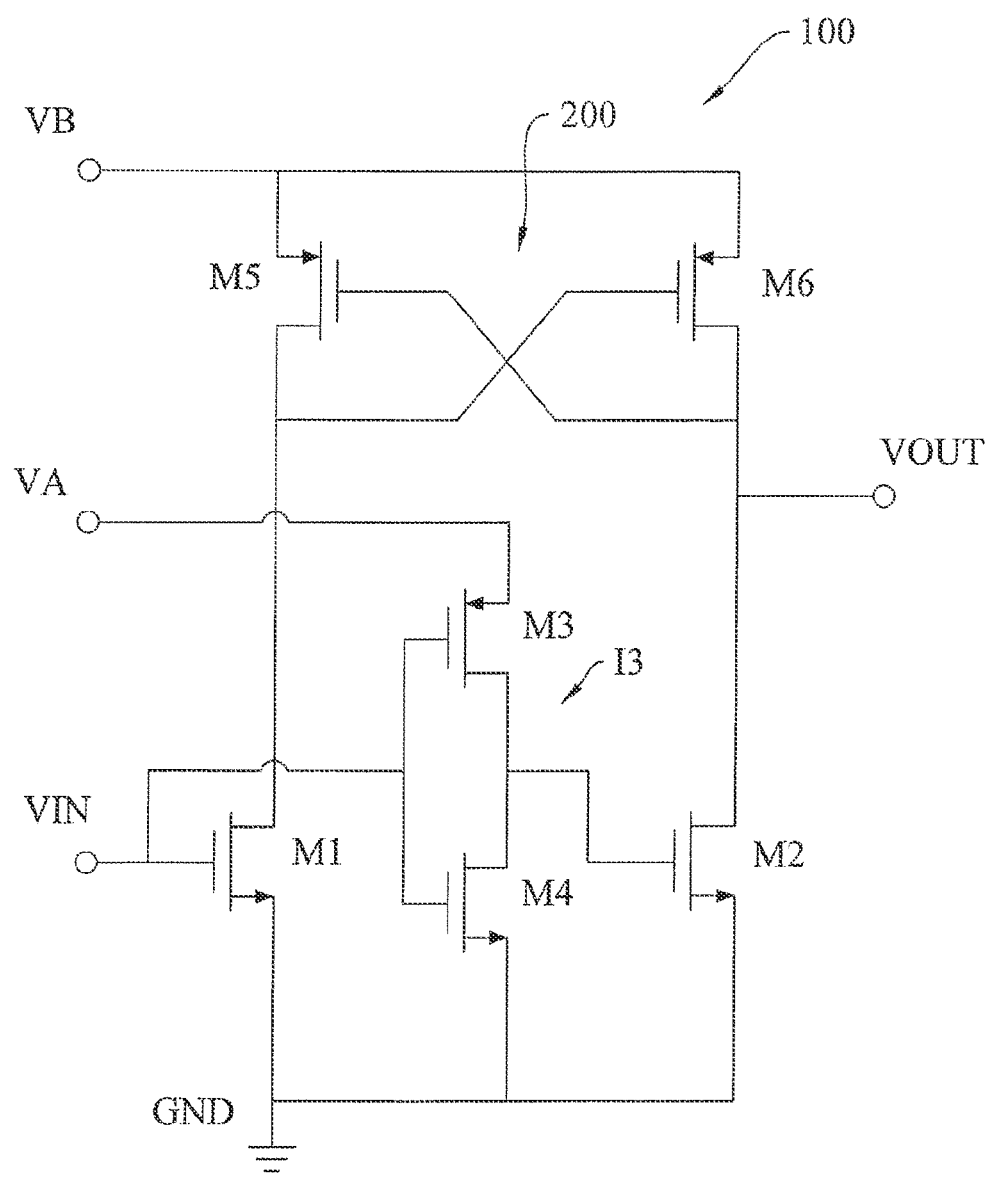
FIG. 1 shows a schematic view of a level shifter device according to the prior art.
Figure 2:
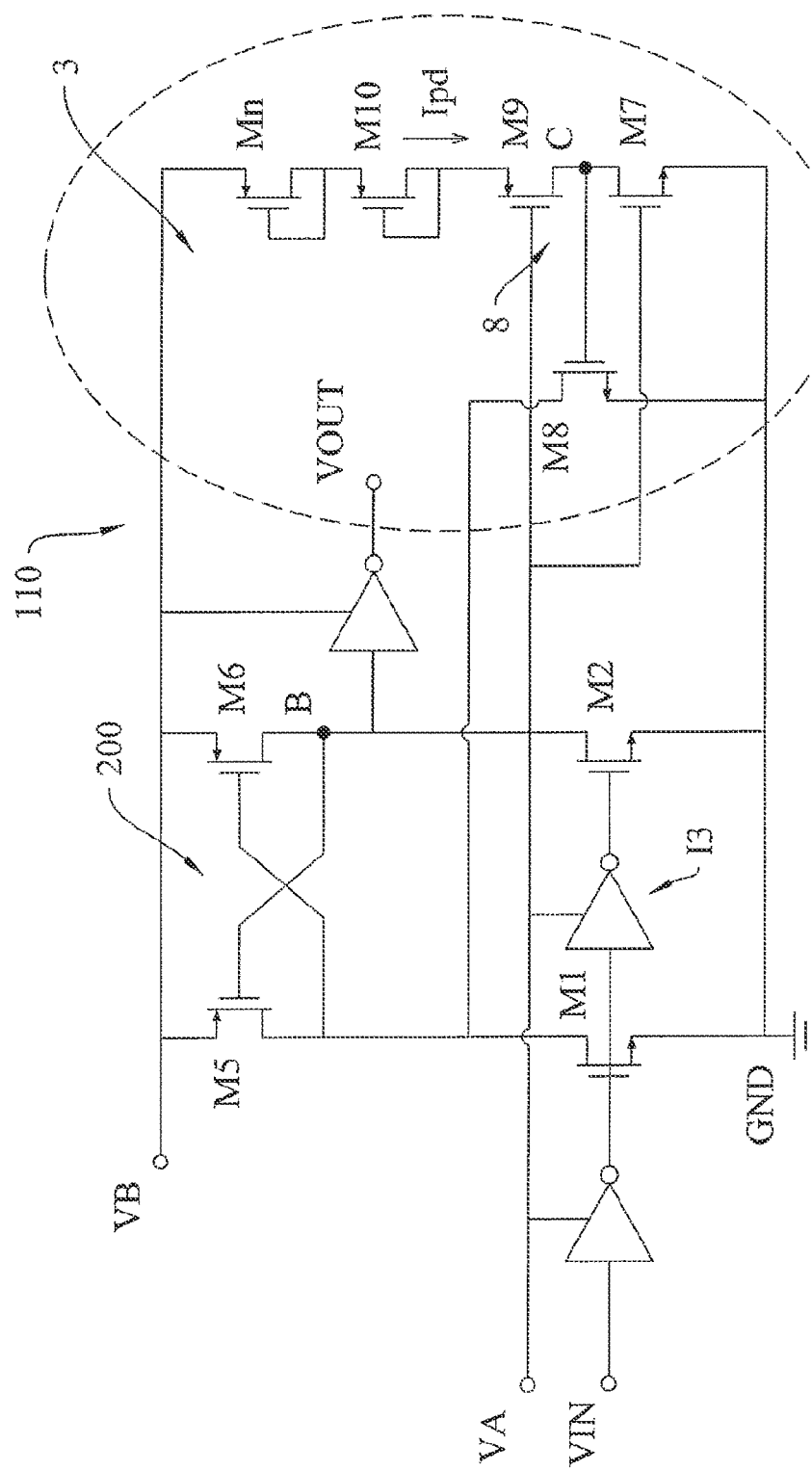
FIG. 2 shows a schematic view of a level shifter device with an additional circuit portion for lowering power consumption according to the prior art.

When both the supply voltages VA, VB are present the level shifter 1 works exactly as the typical configuration of the level shifter in FIG. 1.

When the input signal VIN is low, the transistor M1 is turned off, while the transistor M2 is turned on. A current flows through the second branch and, as a result, the second internal node Q is forced to ground GND, the first internal node QN is forced to the voltage value VB and, consequently, VOUT=0 V.

When the input signal VIN is high, the transistor M2 is turned off, while transistor M1 is turned on. A current flows through the first branch and, as a result, the second internal node Q is forced to the voltage value VB, the first internal node QN is forced to ground GND and consequently, VOUT=VB.

Figure 4:
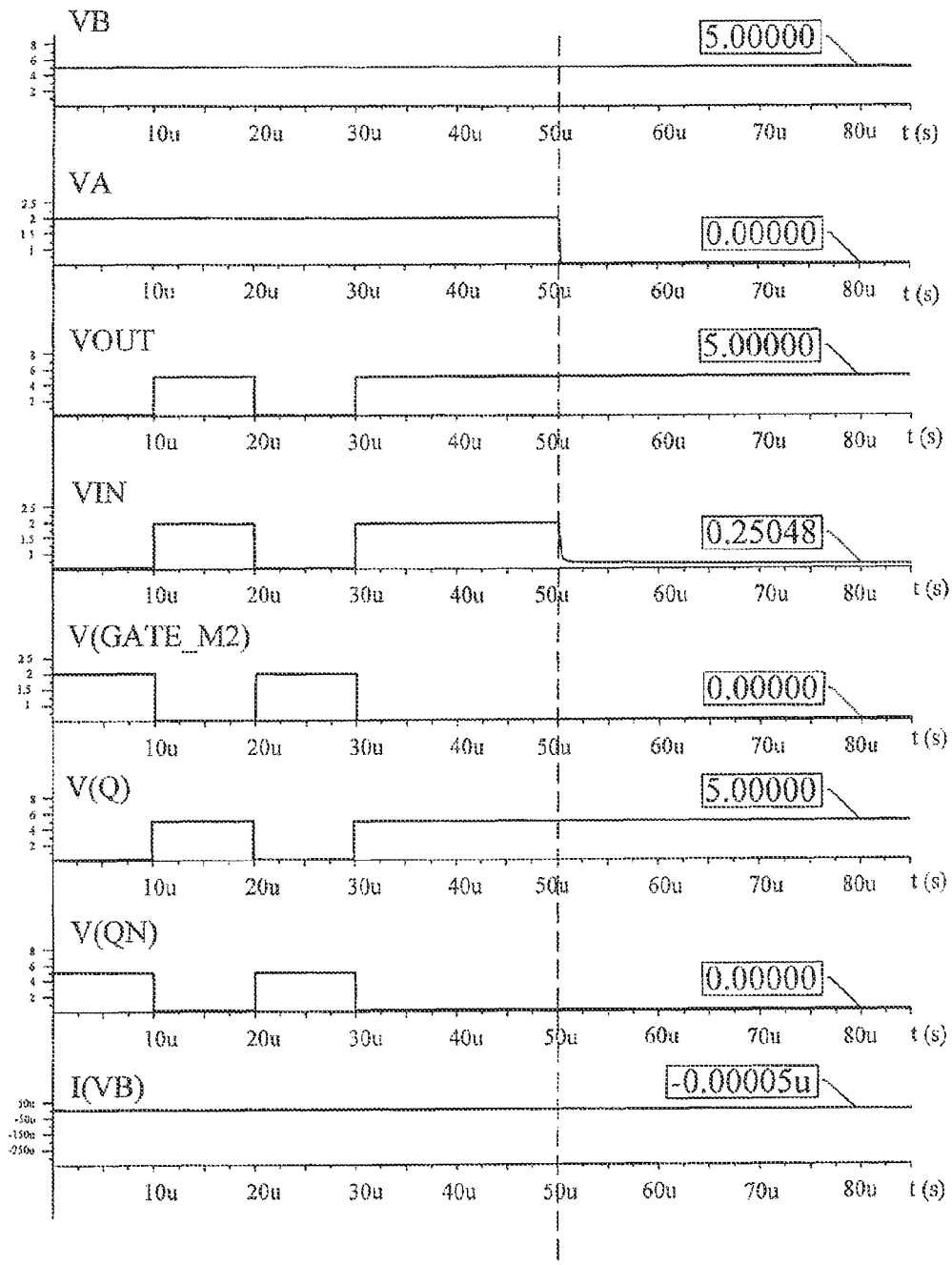
FIG. 4 shows a time diagrams of signals at some circuit nodes of the level shifter according to the present disclosure.

Timing diagrams illustrating the waveforms of signals VA, VB, VOUT, VIN, the voltage V(GATE-M2) at the gate terminal GATE_M2 of the transistor M2, the voltages V(Q), V(QN) at the circuit nodes Q and QN and a static current I(VB) which flows between the second supply voltage VB and ground GND are shown in FIG. 4. Considering the presence of both the supply voltages VA and VB until to 50 µs, there is a normal activity of the level shifter 1 and no static current consumption is necessary. The signal VOUT has the same shape of input signal VIN but with different amplitude since the level shifter 1 has transferred the voltage signal VIN from the voltage level of the primary voltage domain VA to the voltage level of the secondary voltage domain VB.

In the case wherein, for example at 50 µs, the supply voltage VA is no longer available and the last voltage value of the output voltage VOUT at the time instant before 50 µs, that is the time instant wherein the supply voltage VA was available, is high (consequently the voltage at the first internal circuit node QN is low, while the voltage at the second internal circuit node Q is high), the second pull-down component is activated to kept to ground GND the first internal circuit node QN; in fact, the transistor M6 is turned on and this causes the turning off of the transistor M2, preventing that the voltage at the second internal node Q can change value from the high value to the low value. The transistor M1 is not turned off but this is not a problem because a turning on of the transistor M1 by a leakage current could only confirm that the voltage at the first internal circuit node QN is low.

In the case wherein, for example at 50 μs, the supply voltage VA is no longer available and instead the last voltage value of the output voltage VOUT at the time instant before 50 μs, that is the time instant wherein the supply voltage VA was available, is low (consequently the voltage at the first internal circuit node QN is high, while the voltage at the second internal circuit node Q is low), the first pull-down component is activated to kept to ground GND the first internal circuit node Q. In fact, the transistor M5 is turned on and this causes the turning off of the transistor M1, preventing that the voltage at the first internal circuit node QN can change value from the high value to the low value. The transistor M2 is not turned off but this is not a problem because a turning on of the transistor M2 by a leakage current could only confirm that the voltage at the second internal circuit node Q is low.

Therefore, the latch I1 and I2 always stores the last value of the output signal VOUT at the time instant when the first supply voltage VA was available so that the voltage VOUT is always determined, and no cross-conduction is possible from the supply voltage VB. This behavior is shown in FIG. 4; at 50 μs the supply voltage VA is no longer available and the time diagrams show how the input signal VIN stays floating but it does not represent a problem, since it is compatible with the low voltage value at the second internal node Q.

When the first supply voltage VA is not present the indetermination of the output signal VOUT is avoided thus having no power consumption.

The occupation area of the level shifter 1 can be higher of the known level shifters due to the presence of the incremented number of transistors.

What is claimed is:

1. A level shifter device, comprising:
    a first terminal configured to receive a first supply voltage,
    a second terminal configured to receive a second supply voltage,
    an input terminal configured to receive an input signal,
    an output terminal,
    said level shifter device configured to shift the input signal from the level of the first supply voltage to the level of the second supply voltage outputting an output signal at the output terminal,
    wherein said level shifter device comprises:
        a storage circuit configured to store the output signal value; and
        a pull-down circuit coupled to the input terminal and configured to pull down said input terminal in response to a data value stored by said storage circuit.

2. The level shifter device according to claim 1, wherein the storage circuit is a latch comprising a first inverter, having an input terminal connected to a first internal circuit node and an output terminal connected to a second internal circuit node, and a second inverter, cascaded to the first inverter, having an input terminal connected to the second internal circuit node and an output terminal connected to the first internal circuit node, said second internal circuit node being coupled with the output terminal of the level shifter so as to assume the same value of said output signal, said first and second inverters being coupled between the second supply voltage and a reference voltage.

3. The level shifter device according to claim 2, wherein said input terminal comprises a differential first and second inputs, and wherein the pull down circuit comprises a first pull-down component coupled to the first input and a second pull-down component coupled to the second input, said pull down circuit configured, when the first supply voltage is no longer available, to pull-down respectively the first input or the second input in accordance with the high or low value stored by the storage circuit.

4. The level shifter device according to claim 3, wherein the first pull-down component and the second pull-down component are transistors and the latch is configured to drive a control terminal of a first pull-down component transistor in response to the first internal node and drive a control terminal of a second pull-down component transistor in response to the second internal node.

5. The level shifter device according to claim 1, wherein the level shifter comprises:
    a differential input circuit having a first and second inputs and further having first and second outputs coupled to said storage circuit; and
    an inverter having an input terminal connected to the first input of the differential input circuit and an output terminal connected to the second input of the differential input circuit, said another inverter being coupled between the first supply voltage and ground.

6. The level shifter device according to claim 2, wherein the level shifter comprises a differential input circuit including a first transistor coupled between the first internal circuit node and the reference voltage and a second transistor connected between the second internal circuit node and the reference voltage, wherein a control terminal of the first transistor is coupled to the input terminal of the level shifter, and wherein the pull-down circuit is configured, when the first supply voltage is no longer available, to pull-down the input terminal.

7. The level shifter device according to claim 2, further comprising a further inverter arranged between the output terminal of the latch and the output terminal of the level shifter, said further inverter being coupled between the second supply voltage and the reference voltage.

8. A circuit, comprising:
    a differential input stage having a first input configured to receiving an input digital signal and a second input configured to receive a complement of the input digital signal and further having differential outputs;
    a first inverter circuit powered from a relatively lower supply voltage node and configured to generate the complement of the input digital signal;
    a latch circuit powered from a relatively higher supply voltage node and having latch nodes coupled respectively to the differential outputs;
    a second inverter circuit powered from the relatively higher supply voltage node and having an input coupled to one of said latched nodes; and
    a first pull down circuit coupled between the first input and a reference supply node and controlled by said one of said latched nodes of the latch circuit.

9. The circuit of claim 8, further comprising a second pull down circuit coupled between the second input and said reference supply node and controlled by another one of said latched nodes of the latch circuit.

10. The circuit of claim 8, wherein said latch circuit comprises cross-coupled inverter circuits.

11. A method of level shifting, comprising:
    differentially receiving an input digital signal referenced to a relatively lower supply voltage;
    latching an inverted logic state of the received input digital signal in a latch circuit referenced to a relatively higher supply voltage;
    inverting an output of the latched inverted logic state output from the latch circuit using an inverting circuit referenced to the relatively higher supply voltage; and selectively activating a first pull down circuit coupled between a first input of the differentially received input digital signal and a reference supply node in response to first logic state stored at a first latch node of the latch circuit.

12. The method of claim 11, further comprising selectively activating a second pull down circuit coupled between a second input of the differentially received input digital signal and said reference supply node in response to said first logic state stored at a second latch node of the latch circuit.

* * * * *